(12) United States Patent
Chuang

(10) Patent No.: US 8,552,544 B2
(45) Date of Patent: Oct. 8, 2013

(54) PACKAGE STRUCTURE

(75) Inventor: Ching-Hong Chuang, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 407 days.

(21) Appl. No.: 12/848,338

(22) Filed: Aug. 2, 2010

(65) Prior Publication Data
US 2012/0025363 A1 Feb. 2, 2012

(51) Int. Cl.
*H01L 23/02* (2006.01)
*H01L 21/50* (2006.01)

(52) U.S. Cl.
USPC ........... 257/680; 257/678; 257/679; 257/688; 257/E21.499; 257/E23.179; 257/E23.18; 438/106; 438/113; 438/114

(58) Field of Classification Search
USPC .......... 257/680, 678, 679, E23.179, E21.499, 257/E23.18, 688
See application file for complete search history.

(56) References Cited

U.S. PATENT DOCUMENTS 7,746,537 B2 * 6/2010 Natarajan et al. ............. 359/290
2005/0084998 A1 * 4/2005 Horning et al. ................. 438/48

* cited by examiner

*Primary Examiner* — Matthew Reames
*Assistant Examiner* — Benjamin Tzu-Hung Liu
(74) *Attorney, Agent, or Firm* — J.C. Patents

(57) ABSTRACT

A package structure includes first and second substrates, a sealant and a filler. The first substrate has a surface including an active region and a bonding region. The first substrate has a component in the active region and a pad in bonding region. The pad is electrically connected to the component. The sealant is disposed on the surface surrounding the active region. The sealant has a breach at a side of the active region. The second substrate is bonded to the first substrate via the sealant. The second substrate has a first opening corresponding to the pad, and a second opening corresponding to the breach. The filler fills the second opening, covers the breach such that the first substrate, the second substrate, the sealant and the filler together form a sealed space for accommodating the component.

12 Claims, 11 Drawing Sheets

US 8,552,544 B2

PACKAGE STRUCTURE

BACKGROUND

1. Field of the Invention

The present invention relates to a semiconductor structure and a manufacturing method thereof, and more particularly to a packaging structure and a manufacturing method thereof.

2. Description of Related Art

Semiconductor industry is one of the most rapidly advanced hi-tech industries in recent years. Along with the development of electronic technology and the rise of different hi-tech electronic industries, electronic products of improved user-friendliness and better performance have been brought into the market continuously. The design trend of these electronic products is light, thin, short, and small. In the semiconductor industry, the production of integrated circuits (IC) mainly divides into three stages: IC design, IC process and IC package. The package of IC protects the chip from the effects of external temperature, humidity and contamination, and provides a medium of electric connection between the chip and the external circuits.

FIGS. 1A to 1D are schematic diagrams showing a process of fabricating a projector chip package structure according to the prior art. As shown in FIG. 1A, a micro-electro-mechanical wafer 50 disposed with a plurality of components 52 and a plurality of pads 54 is provided. A sealant 56 is configured surrounding each component 52, and each sealant 56 has a breach 56a. Then, as shown in FIG. 1B, a glass wafer 60 is bonded with the micro-electro-mechanical wafer 50 via the sealants 56. As shown in FIG. 1C, the dicing of the above micro-electro-mechanical wafer 50 and glass wafer 60 is achieved via a water knife process. To prevent liquids from penetrating from the breach 56a into the space between the micro-electro-mechanical wafer 50 and the glass wafer 60 while allowing the pad 56 to remain exposed by the glass wafer 60, the micro-electro-mechanical wafer 50 and the glass wafer 60 are respectively pre-diced and are separated by a stripping method into a single package structure 100 as shown in FIG. 2. In the package structure 100, the pad 54 positioned at the micro-electro-mechanical wafer 50 is exposed by the glass wafer 60 for electrical connection with other external devices. Moreover, after an anti-adhesion coating process is performed on the component 52 through the breach 56a, a filler 70 fills the breach 56a to seal the component 52 in between the micro-electro-mechanical wafer 50 and glass wafer 60.

In the above dicing method of the micro-electro-mechanical wafer 50 and glass wafer 60, in order to prevent damages to the component 52 due to the penetration of liquids from the breach 56a into the space between the micro-electro-mechanical wafer 50 and the glass wafer 60, the dicing process is performed in stages. Accordingly, the fabrication process is prolonged and the cost is thereby increased.

SUMMARY OF THE INVENTION

The present invention is directed to a package structure, wherein the manufacturing cost can be lower.

The present invention is directed to a package structure, wherein the manufacturing process can be more time efficient.

The present invention provides a package structure including a first substrate, a sealant, a second substrate and a filler. The first substrate has a surface, wherein the surface has an active region and a bonding region outside the active region. The substrate includes a component in the active region and a pad in the bonding region. The pad electrically connects to the component. The sealant is disposed on the surface surrounding the active region, wherein the sealant has a breach at a side of the active region. The second substrate is integrated with the first substrate via the sealant, wherein the substrate includes a first opening and a second opening. The first opening corresponds to the pad, wherein the first opening provides a connection between an external device and the pad, and the second opening corresponds to the breach. The filler is configured in the second opening, filling the breach, so that the first substrate, the second substrate, the sealant and the filler together form a sealed space for accommodating the component.

According to an aspect of the invention, the second substrate is a transparent substrate.

According to an aspect of the invention, the second opening extends in a downward direction toward the surface of the substrate and in a lateral direction along the surface to connect to the breach.

According to an aspect of the invention, the second opening tapers in a direction away from the surface of the first substrate.

According to an aspect of the invention, an edge of the first substrate is flush with an edge of the second substrate.

The present invention further provides a method of fabricating a package structure. The method includes providing a first substrate, wherein the first substrate has a surface, and the surface is divided into a plurality of blocks. Each block includes an active region and a bonding region outside the active region, wherein the active region includes a component therein, while the bonding region includes a pad therein. Each component is electrically connected to each corresponding pad. A sealant is formed surrounding the active region of each block, and each sealant includes a breach at a side of the corresponding active region. A second substrate is disposed above the first substrate, wherein the second substrate is bonded to the first substrate via the sealant. The second substrate includes a plurality of first openings and a plurality of second openings, wherein each of the first openings respectively corresponds to the pad of each block, such that an external device may be connected to the pad of each block via the first openings. Each of the second openings respectively corresponds to the breach of the sealant. An anti-adhesion coating process is performed on the corresponding component through each of the second openings. A plurality of fillers is formed inside the second openings, wherein the fillers respectively fill the breaches, so that the first substrate, the second substrate, the sealants and the fillers together form a plurality of sealed spaces for accommodating the components. The first substrate and the second substrate are then diced to separate the plurality of blocks to form a plurality of package structures.

According to an aspect of the invention, the aforementioned anti-adhesion coating process comprises forming a self-assembled monomolecular film on the surface of each component.

According to an aspect of the invention, UV light irradiation is performed on the sealants to cure the sealants after the second substrate is disposed above the first substrate.

According to an aspect of the invention, UV light irradiation is performed on the fillers to cure the fillers after the fillers are disposed inside the plurality of second openings.

According to an aspect of the invention, the first substrate and the second substrate are concurrently diced in a same dicing process.

Accordingly, the second substrate of the exemplary embodiment of the invention includes a first opening and a second opening. The first opening corresponds to the pad, allowing the pad to be electrically connected with other external devices. The second opening corresponds to the breach of the sealant. Accordingly, an anti-adhesion coating process may be performed on the component through the second opening. Further, filler is used to fill the breach, and the first substrate and the second substrate are diced thereafter. Hence, penetration of liquids into the space between the first substrate 210 and the second substrate 230 during the dicing process may be prevented. Accordingly, the dicing of the first substrate and the second substrate via the predice-and-strip method for the purpose of exposing the pad and obviating the penetration of liquids through the breach could be circumvented. Instead, the first substrate and the second substrate may be directly and concurrently diced in a same dicing process, and both the fabrication time and cost could be more efficient.

In order to the make the aforementioned and other objects, features and advantages of the present invention comprehensible, a preferred embodiment accompanied with figures are described in detail below.

DESCRIPTION OF EMBODIMENTS

Figure 1A:
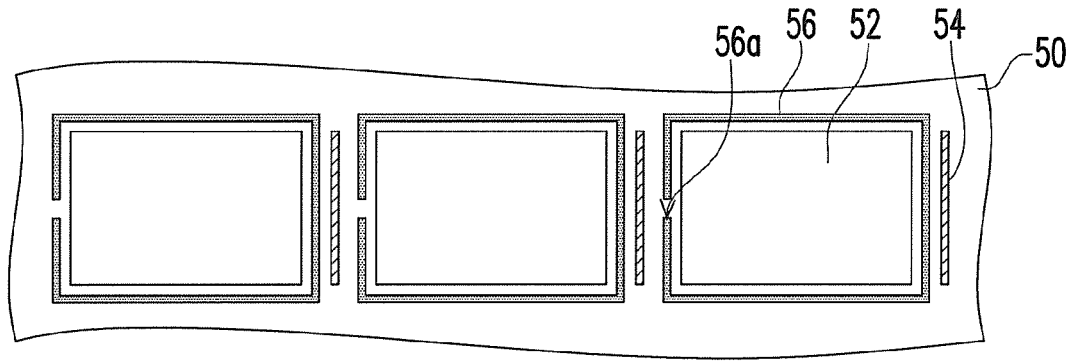
FIGS. 1A to 1D are schematic diagrams showing a process of fabricating a projector chip package structure according to the prior art.
Figure 1B:
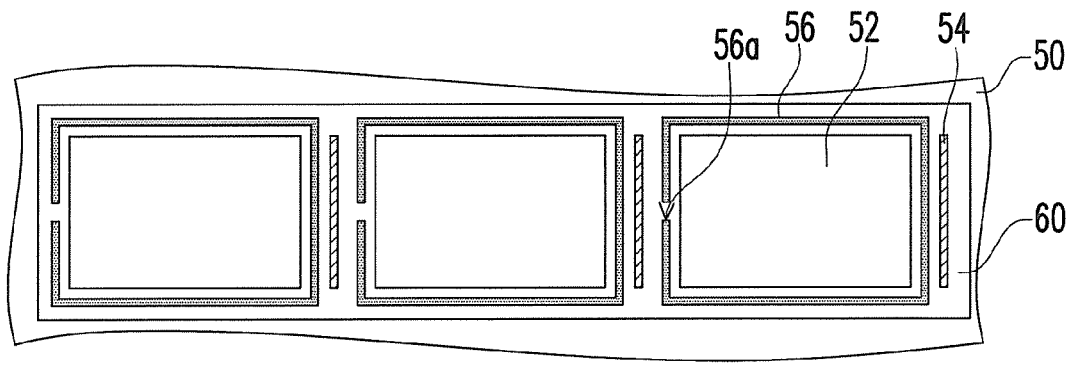
Figure 1C:
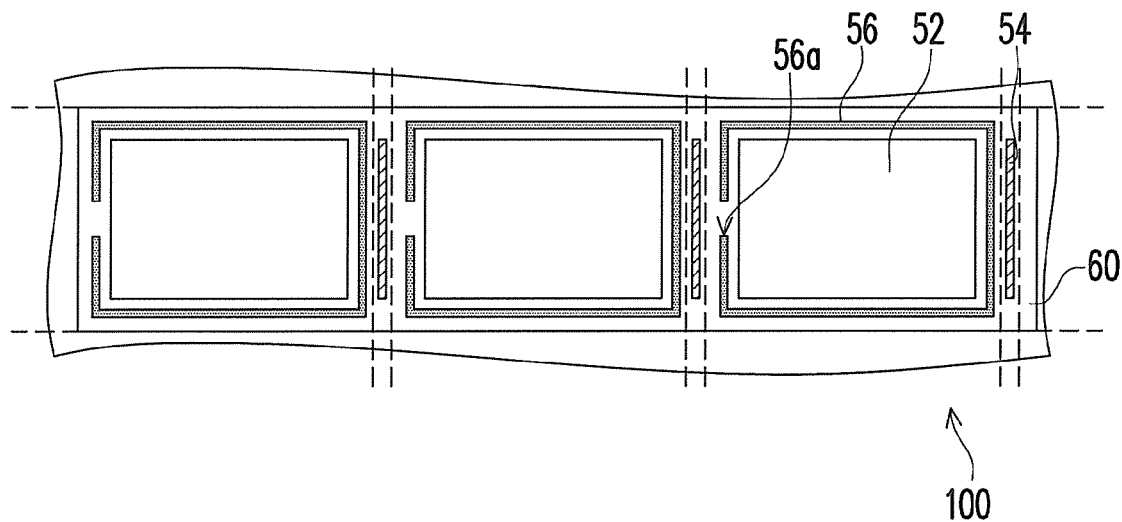
Figure 1D:
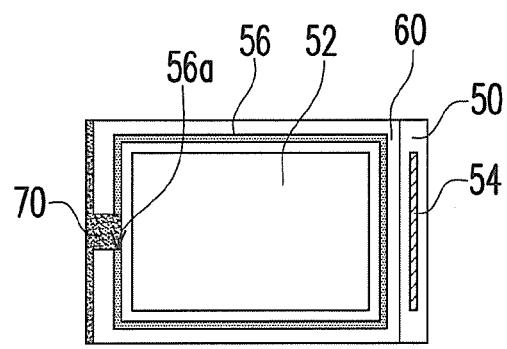
Figure 2:
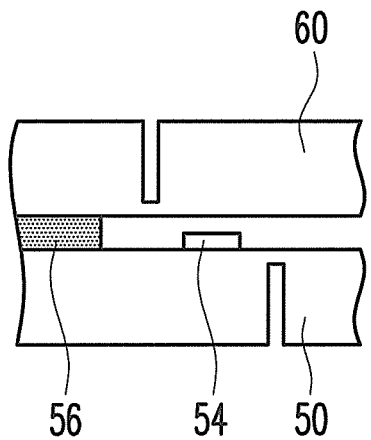
FIG. 2 is a schematic diagram showing a pre-dicing of a wafer according to the prior art.
Figure 3:
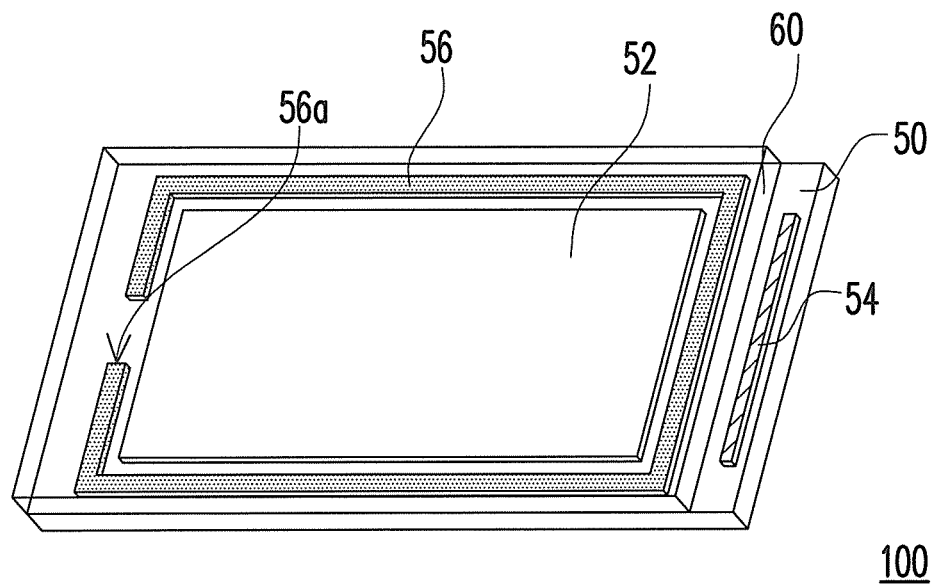
FIG. 3 is a perspective, three-dimensional view diagram of the package structure in FIG. 1C.
Figure 4A:
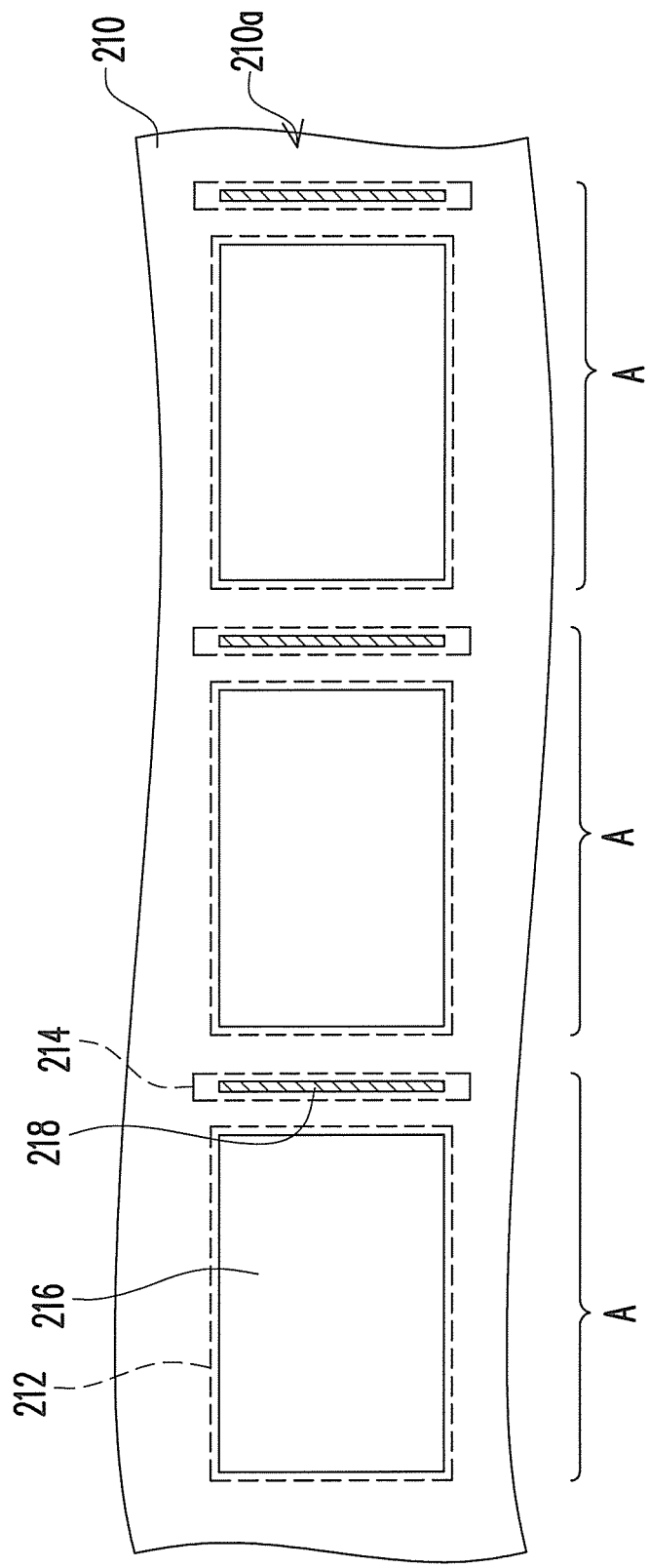
FIGS. 4A to 4E are schematic cross-sectional diagrams illustrating a process of fabricating a package structure according to an exemplary embodiment of the invention.
Figure 4B:
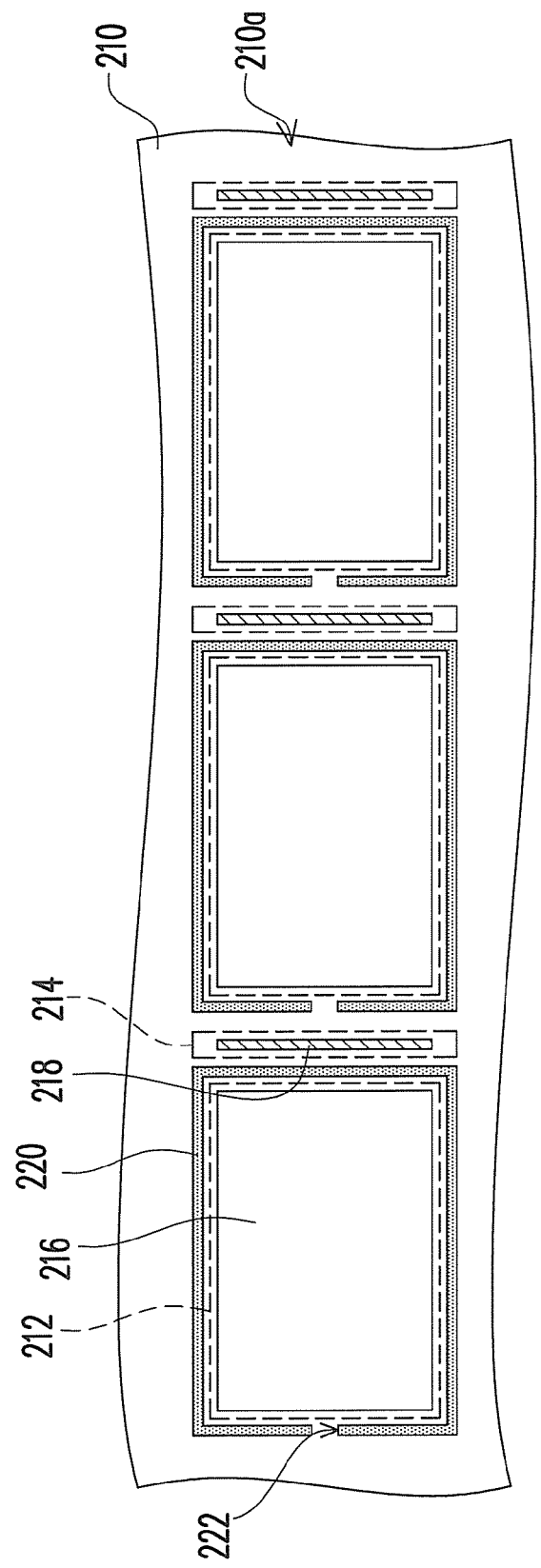

FIGS. 4A to 4E schematic, cross-sectional diagrams illustrating exemplary steps for fabricating a package structure according to an embodiment of this invention. FIG. 5 is a flow diagram of steps showing exemplary process that may be used in the fabrication of the package structure of FIGS. 4A to 4E. Referring to FIG. 4A and step S602 in FIG. 5, a first substrate 210 is provided, wherein the first substrate 210 has a surface 210a. The surface 210a includes a plurality of blocks A, each block A includes an active region 212 and a bonding region 214 outside the active region 212. The active region 212 includes a component 216, while the bonding region 214 includes a pad 218. Each component 216 is electrically connected to a corresponding pad 218. As shown in FIG. 4B and step S604 in FIG. 5, a sealant 220 is formed to surround each corresponding active region 212. Each sealant 220 has a breach 222 at a side of the active region 212 to facilitate the subsequently performed anti-adhesion coating process.

Figure 4C:
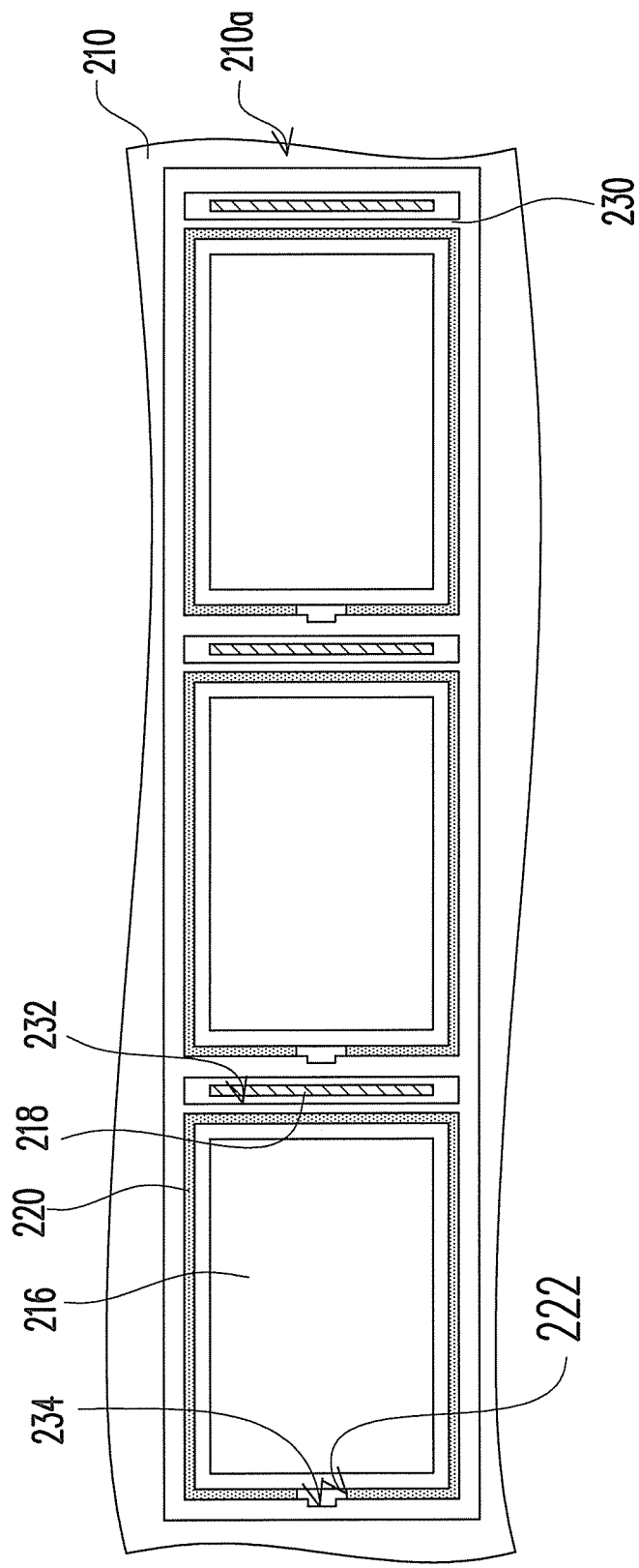
Figure 5:
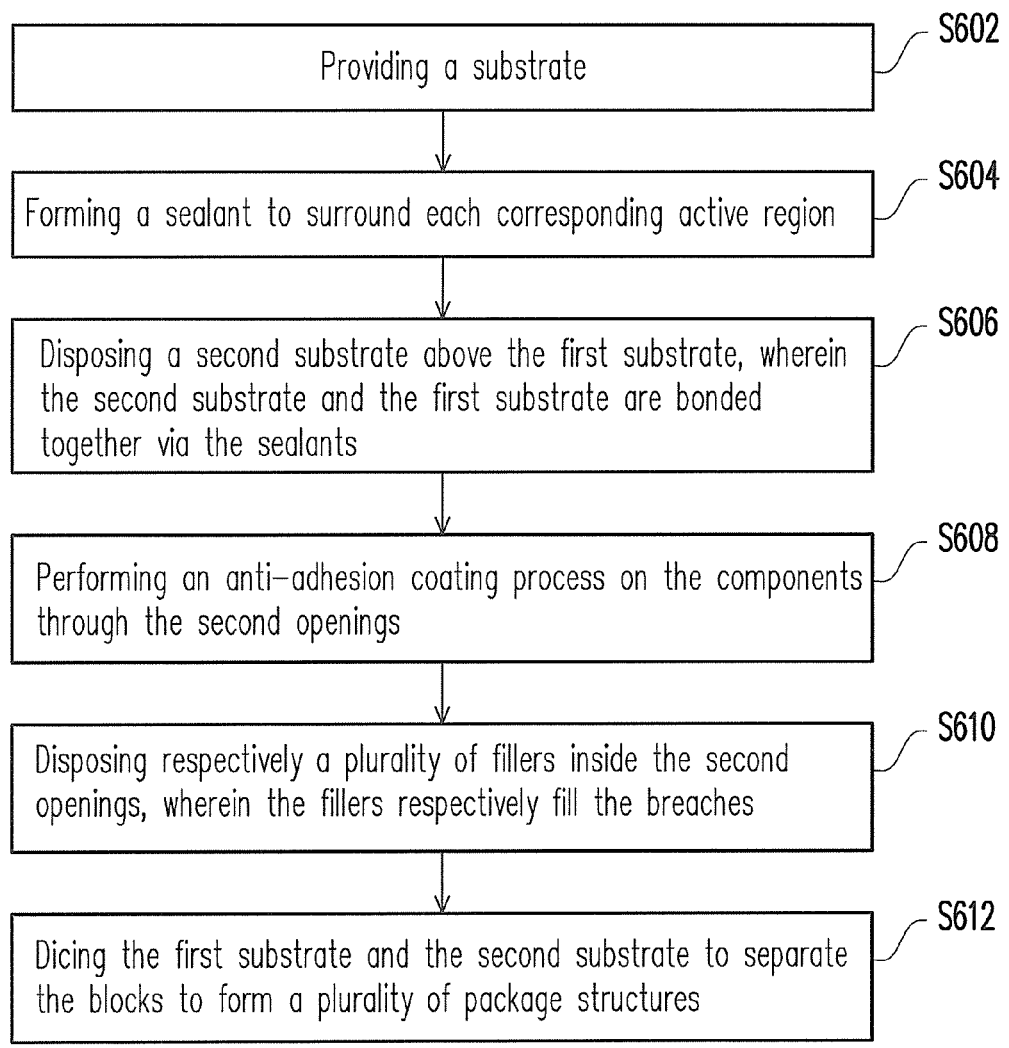
FIG. 5 is a flow diagram of steps showing exemplary process that may be used in the fabrication of the package structure of FIGS. 4A to 4E.

Referring to FIG. 4C and step S606 in FIG. 5, a second substrate 230 is disposed above the first substrate 210, wherein the second substrate 230 and the first substrate 210 are bonded together via the sealants 220. The second substrate 230 includes a plurality of first openings 232 and a plurality of second openings 234. The first openings 232 respectively correspond to the pads 218, allowing the pads 218 to be connected to other external devices through the first openings 232, while the second openings 234 respectively correspond to the breaches 222. Thereafter, referring to step S608 in FIG. 5, an anti-adhesion coating process is performed on the components 216 through the second openings 234 and the breaches 222, wherein the anti-adhesion coating process is performed by, for example, forming a self-assembled monomolecular film on the surface of each component 216 so that each component 216 could become hydrophobic to prevent moisture adhesion, which may affect the normal operation of the components 216.

Figure 4D:
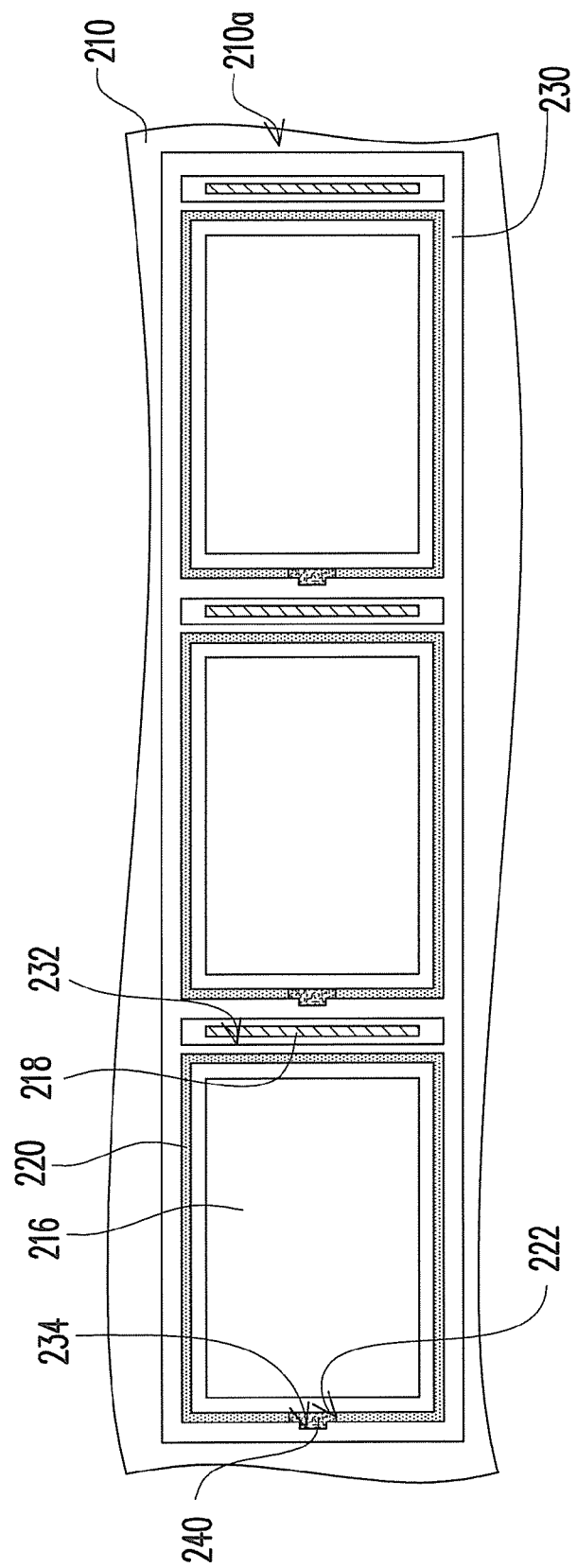
Figure 4E:
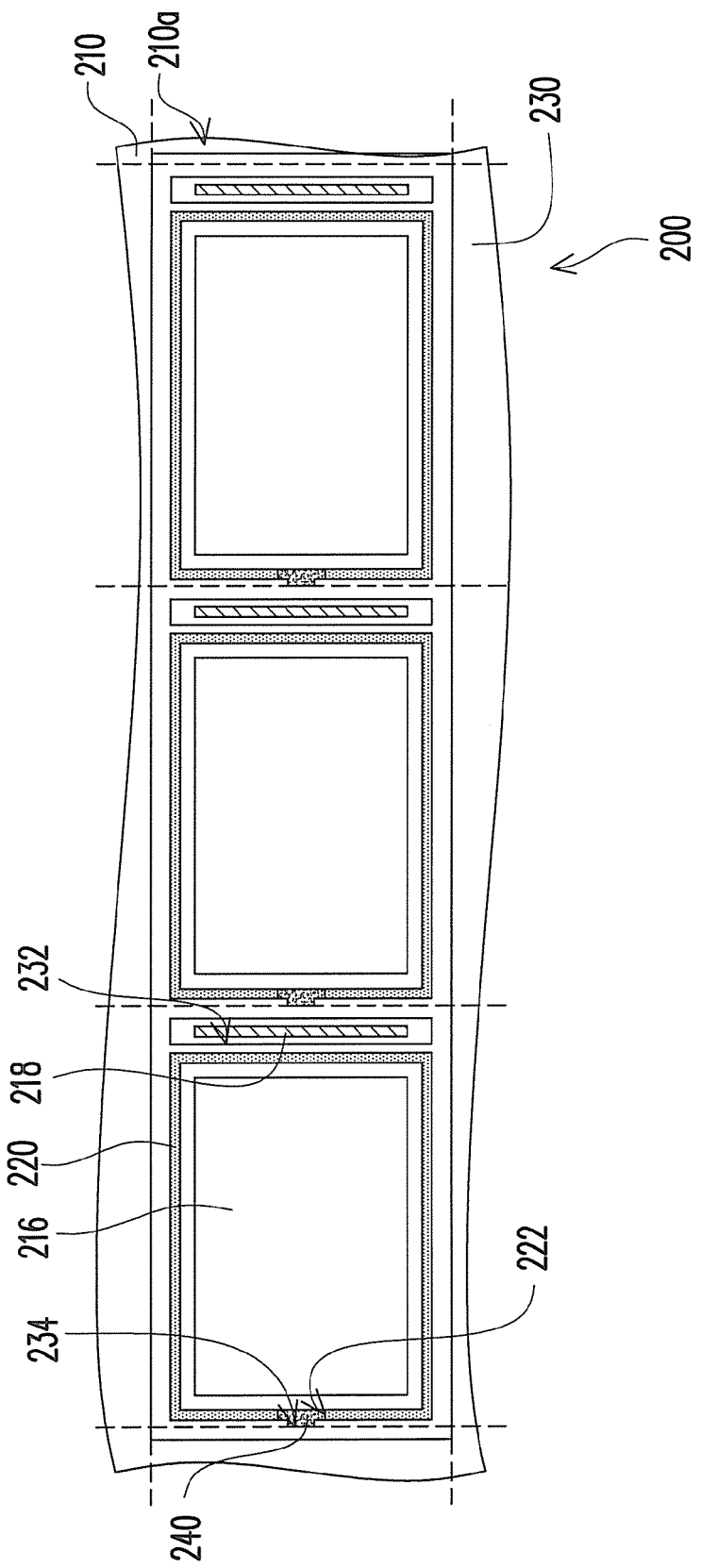
Figure 6A:
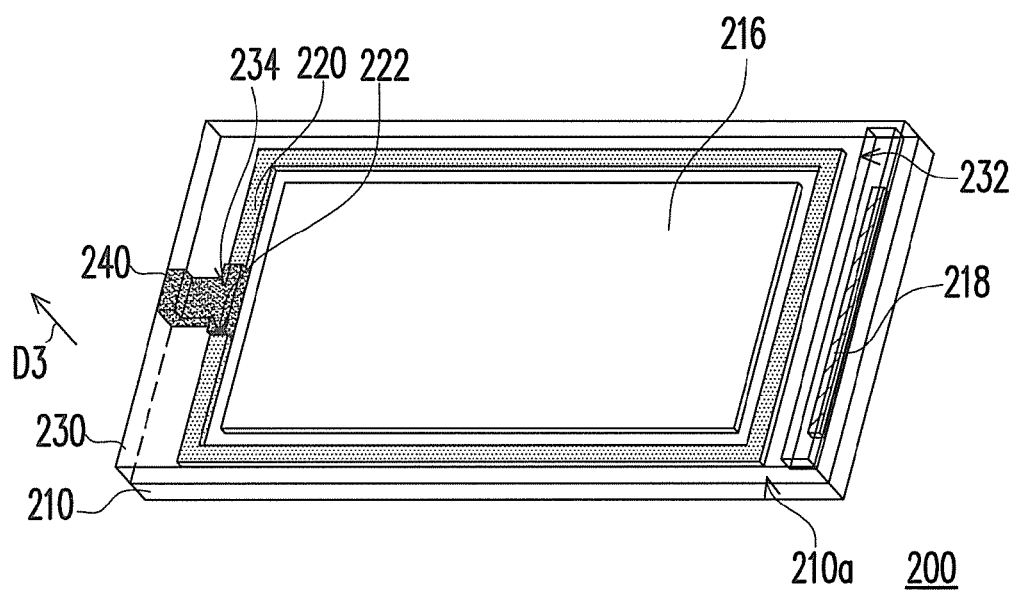
FIG. 6A is a perspective diagram of the package structure in FIG. 4E.

Referring to FIG. 4D and step S610 in FIG. 5, after performing an anti-adhesion coating process on each component 216, a plurality of fillers 240 is respectively disposed inside the second openings 234, wherein the fillers 240 respectively fill the breaches 222. The first substrate 210, the second substrate 230, the sealants 22 and the fillers 240 together form a plurality of sealed spaces for accommodating the components 216. Referring to FIG. 4E and step S612 in FIG. 5, the first substrate 210 and the second substrate 230 are diced to separate the blocks A (depicted in FIG. 4A) to form a plurality of package structures 200 as shown in FIG. 6A.

It is worthy to note that, the first openings 232 of the second substrate 230 correspond to the pads 218, allowing the pads 218 to be able to electrically connect to other external devices. Further, the second openings 234 of the second substrate 230 correspond to the breaches 222 of the sealants 220, in which the anti-adhesion coating process may be performed on the components 216 through the second openings 234 of the second substrate 230. Fillers 240 are then used to fill the breaches 222, followed by dicing the first substrate 210 and the second substrate 230, and fluids may be prevented from penetrating into the space between the first substrate 210 and the second substrate 230 during the dicing process. Accordingly, the dicing of the first substrate 210 and the second substrate 230 via the predice-and-strip method for the purpose of exposing the pad 218 and obviating the penetration of liquids through the breaches 222 could be circumvented. The first substrate 210 and the second substrate 230 may be directly and concurrently diced in a same dicing step to reduce the time and cost on fabrication.

The package structure 200 of the exemplary embodiment of the invention is, for example, a projector chip package structure, wherein the first substrate 210 is, for example, a micro-electro-mechanical wafer, while the second substrate 230 is a transparent glass wafer. The invention, however, is not limited to a particular form of package structure 200. In other exemplary embodiments, the package structure 200 may be other types of package structure 200. Further, the sealants 220 in the exemplary embodiment are, for example, light curable glue, and the fabrication method of the aforementioned package structure includes performing UV irradiation on the sealants 220 to cure the sealants 220 after the second substrate 230 is disposed above the first substrate 210. In the exemplary embodiment, the fillers are, for example, light curable glue, and the fabrication method of the aforementioned package structure includes disposing the fillers 240 inside the second openings 234, followed by performing UV irradiation on the fillers 240 to cure the fillers 240.

In other exemplary embodiments, the sealants 220 and the fillers 240 may include thermally-curable adhesives or glues curable by other methods.

Figure 6B:
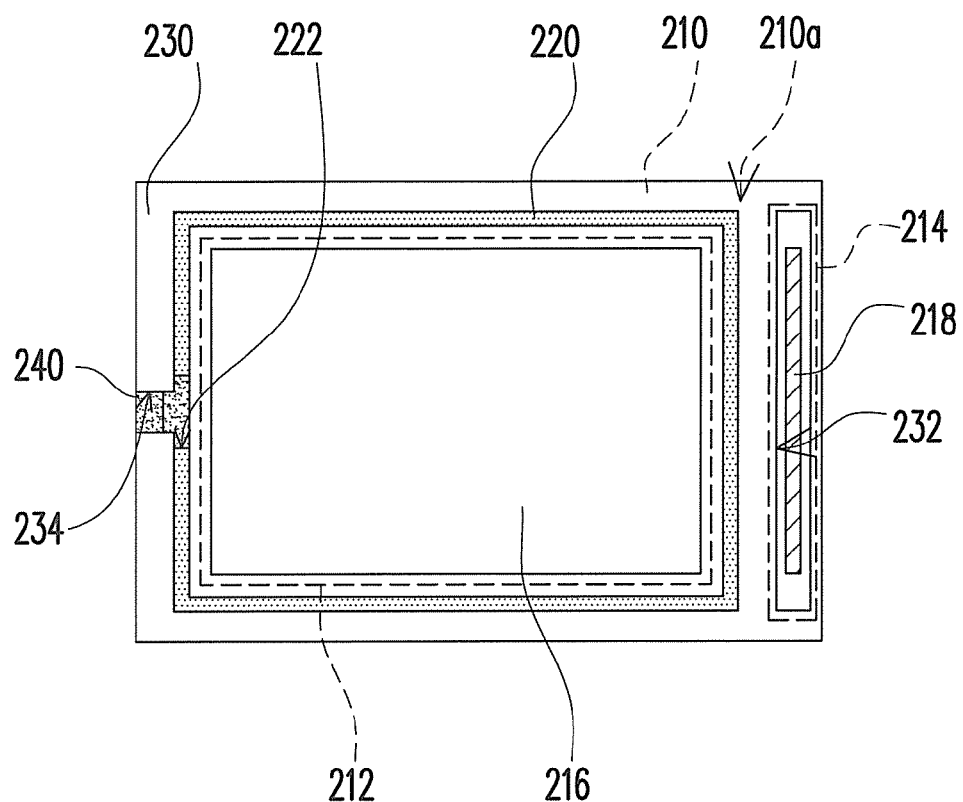
FIG. 6B is a top view diagram of the package structure in FIG. 4E.

FIG. 6A is a perspective 3-D view diagram of the package structure in FIG. 4E. FIG. 6B is a top view diagram of the package structure in FIG. 4E. Referring to FIGS. 6A and 6B, the package structure 200 of an exemplary embodiment of the invention includes a first substrate 210, a sealant 220, a second substrate 230 and filler 240. The first substrate has a surface 210a, wherein the surface 210a includes an active region 212 and a bonding region 214 configured outside the active region 212. The first substrate 210 also includes a component 216 in the active region 212, and a pad 218 in the bonding region 214. The pad 218 is electrically connected to the component 216.

The sealant 220 is disposed on the surface 210a surrounding the active region 212, wherein the sealant 220 has a breach 222 at the side of the active region 212. The second substrate 230 and the first substrate 210 are correspondingly bonded together via the sealant 220, wherein the second substrate 230 has a first opening 232 and a second opening 234, and the first opening 232 corresponds to the pad 218, in which connection of other external devices to the pad 218 through the opening 232 would be feasible, while the second opening corresponds to the breach 222. The filler 240 is configured inside the second opening and fills the breach 222. Accordingly, the first substrate 210, the second substrate 230, the sealant 220 and the filler 240 together form a sealed space for accommodating the component. It is worthy to note that, since the first substrate 210 and the second substrate 230 are directly and concurrently diced in a same dicing step, the edge of the first substrate 210 in the package structure 200 is aligned and flush with the edge of the second substrate 230.

Figure 6C:
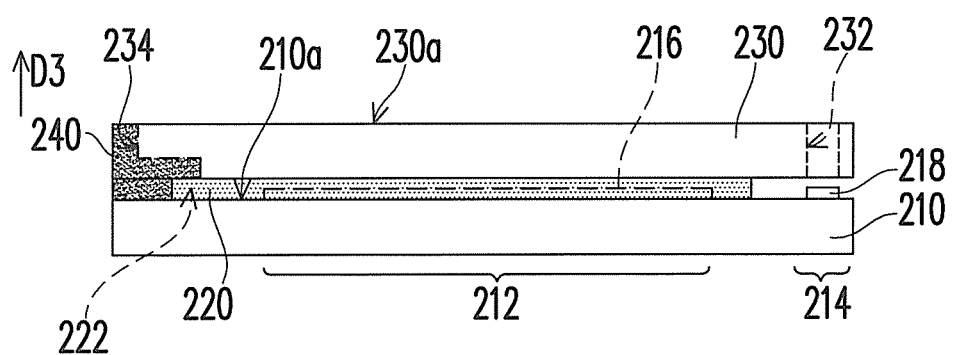
FIG. 6C is a side view diagram of the package structure in FIG. 4E.

FIG. 6C is a schematic side view of the package structure in FIG. 4E. More specifically speaking, as shown in FIG. 6C, the second opening 234 in an exemplary embodiment of the invention is designed to extend in a downward direction from the top surface 230a of the second substrate 230 toward the surface 210a of the first substrate 210 and in a direction along the surface 210a toward the breach 222. Referring also to FIG. 6A, the second opening 234 is designed to taper along the direction D3 away from the surface 210a. Accordingly, the design of the structure of the second opening 234 facilitates the agglomeration of the filler at the breach 222 to ensure that the breach 222 is filled.

Accordingly, the second substrate of an exemplary embodiment of the invention includes a first opening and the second opening. The first opening corresponds to the pad, enabling the pad to be electrically connected with an external source. The second opening corresponds to the breach of the sealant. Hence, an anti-adhesion coating process may be performed on the component through the second opening. Further, the first substrate and the second substrate are diced after the breach is filled. Accordingly, the penetration of liquids into the space between the first substrate and the second substrate during the dicing process may be prevented. Further, the dicing of the first substrate and the second substrate via the predice-and-strip method for exposing the pad and obstructing the penetration of liquids through the breach could be obviated. In fact, the first substrate and the second substrate may be diced concurrently to substantially reduce the time and cost on manufacturing. Additionally, the second opening may be designed to extend in a downward direction toward the surface of the first substrate and along a lateral direction of the surface of the first surface toward the breach. The second opening is tapered in a direction away from the surface, prompting the flow of the filler to the breach to ensure that the breach is filled.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A package structure, comprising:
a first substrate, comprising a surface, wherein the surface includes an active region and a bonding region outside the active region, the first substrate comprises a component in the active region and a pad in the bonding region, and the pad is electrically connected to the component;
a sealant, disposed on the surface of the first substrate and surrounding the active region, wherein the sealant comprises a breach at a side of the active region;
a second substrate, integrated with the first substrate via the sealant, wherein the second substrate comprises a first opening and a second opening, and the first opening corresponds to the pad for providing a connection between an external device and the pad via the first opening, and the second opening corresponds to and exposes the breach; and
a filler, disposed in the second opening and filling up the breach so that the first substrate, the second substrate, the sealant and the filler together form a sealed space for accommodating the component, wherein a size of the filler that is filled in the second opening becomes smaller along a direction perpendicular to the surface and away from the surface, a lateral surface of the filler is coplanar with a lateral surface of the first substrate and a lateral surface of the second substrate.

2. The package structure of claim 1, wherein the second substrate is a transparent substrate.

3. The package structure of claim 1, wherein the second opening extends from the second substrate in a downward direction toward the surface of the first substrate and extends laterally along the surface to connect with the breach.

4. The package structure of claim 1, wherein the second opening is tapered in a direction away from the surface of the first substrate.

5. The package structure of claim 1, wherein the second opening comprises a first part and a second part connected between the first part and the breach, and a width of the first part is smaller than a width of the second part.

6. The package structure of claim 1, wherein the sealant is a light curable glue.

7. The package structure of claim 1, wherein the sealant is a thermally-curable adhesive.

8. The package structure of claim 1, wherein the filler is a light curable glue.

9. The package structure of claim 1, wherein the filler is a thermally-curable adhesive.

10. The package structure of claim 1, wherein the sealant and the filler are made of the same material.

11. The package structure of claim 1, further comprises a self-assembled monomolecular film covering the component.

12. The package structure of claim 1, wherein the second opening is extended to the lateral surface of the second substrate.

* * * * *